United States Patent [19]

Cheney et al.

[11] Patent Number: 4,887,135

[45] Date of Patent: Dec. 12, 1989

[54] DUAL LEVEL POLYSILICON SINGLE TRANSISTOR-CAPACITOR MEMORY ARRAY

[75] Inventors: Glen T. Cheney, Allentown, Pa.; Howard C. Kirsch, Colorado Springs, Colo.; James T. Nelson, Coopersburg, Pa.; James H. Stefany, Asbury, N.J.

[73] Assignee: American Telephone and Telegraph Company, AT&T Bell Laboratories, Murray Hill, N.J.

[21] Appl. No.: 694,487

[22] Filed: Jan. 24, 1985

Related U.S. Application Data

[63] Continuation of Ser. No. 347,309, Feb. 9, 1982, abandoned.

[51] Int. Cl.[4] ................... H01L 29/78; H01L 27/02; H01L 27/10; H01L 29/04
[52] U.S. Cl. ................................ 357/23.6; 357/41; 357/45; 357/59
[58] Field of Search .................. 357/23.6, 41, 45, 59; 365/174, 182

[56] References Cited

U.S. PATENT DOCUMENTS

| | | | |
|---|---|---|---|
| 4,112,575 | 9/1978 | Fu et al. | 357/41 |
| 4,141,027 | 2/1979 | Baldwin et al. | 357/41 |
| 4,152,779 | 5/1979 | Tasch, Jr. et al. | 357/41 |
| 4,163,243 | 7/1979 | Kamins et al. | 357/41 |
| 4,164,751 | 8/1979 | Tasch, Jr. | 357/41 |
| 4,180,826 | 12/1979 | Shappir | 357/41 |
| 4,198,694 | 4/1980 | Eaton, Jr. et al. | 365/149 |
| 4,240,196 | 12/1980 | Jacobs et al. | 357/59 |
| 4,290,186 | 9/1981 | Klein et al. | 357/23 C |
| 4,317,690 | 3/1982 | Koomen et al. | 357/59 |
| 4,334,236 | 6/1982 | Hoffmann et al. | 357/45 |
| 4,355,374 | 10/1982 | Sakai et al. | 357/23 C |
| 4,397,077 | 8/1983 | Derbenwick et al. | 357/23 C |
| 4,538,166 | 8/1985 | Nakano | 357/23.6 |

FOREIGN PATENT DOCUMENTS 0032030 12/1980 European Pat. Off. .
2067352A 1/1980 United Kingdom .

OTHER PUBLICATIONS

M. Yamada et al, "IEDM Technical Digest", *International Electron Devices Meeting* Washington, D.C., Dec. 8-9-10, 1980, pp. 578-581.
Robert Bernhard, "The 64-kb RAM Teaches a VLSI Lesson" IEEE Spectrum, Jun. 1981, pp. 38-42.
"Polysilicon Drain Mosfet memory Cell", *IBM Technical Disclosure Bulletin*, vol. 20, No. 2, A. G. Fortino and R. Silverman, Jul. 1977, pp. 539-540.
K. Itoh et al, "Random Access Memories", *IEEE International Solid-State Circuits Conference*, Feb. 1980, pp. 228-229.
I. Lee et al, "Dynamic Memories", *IEEE International Solid-State Circuits Conference*, Feb. 1979, pp. 146-147.
E. A. Reese et al, "Memories and Redundancy Techniques", *IEEE International Solid-State Circuits Conference*, Feb. 1981, pp. 88-89, 260.

Primary Examiner—J. Carroll
Attorney, Agent, or Firm—J. H. Fox

[57] ABSTRACT

A self-aligned one transistor-capacitor memory cell is provided which uses an n-channel MOS transistor having separate drain and source regions with a first level polysilicon conductor coupled to the top plate of the capacitor and separate second level polysilicon conductors coupled to the gate and drain of the transistor. A reduction in a dimension of the memory cell is achieved compared to a similar memory cell which uses only one level of conductors.

6 Claims, 2 Drawing Sheets ns of second level polysilicon conductors are connected to the gate electrode and drain region. The source region can be as small as is possible to reasonably fabricate since the spacing between the first level polysilicon connecting to the gate electrode and the second level polysilicon connecting to capacitor electrode is typically less than a minimum size source region. This reduces the physical size of the memory cell and therefore reduces the size of arrays of the cells and the RAM's in which the arrays are used.

These and other features and advantages of the invention are better understood from a consideration of the following detailed description taken in conjunction with the accompanying drawings.

DUAL LEVEL POLYSILICON SINGLE TRANSISTOR-CAPACITOR MEMORY ARRAY

This application is a continuation of application Ser. No. 347,309, filed Feb. 9, 1982, now abandoned.

BACKGROUND OF THE INVENTION

This invention relates to semiconductor memories and more particularly to improved memory cells.

Ever increasing high capacity MOS random access memories (RAM's) are being developed with 64K memories being produced in reasonably large quantities and with 256K memories being produced in limited quantities. U.S. Pat. No. 4,112,575 described memory arrays using single level conductors with memory cells which each have an n-channel MOS transistor with separated drain and source regions and have a capacitor coupled to the source. It also describes memory arrays using dual level conductors with memory cells which each have a single drain/source region and have a capacitor separated from the drain/source region by the channel of the transistor. The described single level conductor memory cell is limited in size by minimum spacing requirements between adjacent conductors. The dual level conductor memory cell can be made physically smaller than the single level conductor memory cell. To insure proper operation of the dual conductor embodiment, it is desirable to extend the substrate portion of the capacitor so that it extends past the top plate of the capacitor and is partly covered by the gate electrode. This adds undesirable capacitive loading onto the gate and can cause variations in charge (logic information) stored in the capacitor as the gate (word line) potential is varied to access the memory cell.

It is desirable to have a one transistor-capacitor MOS memory cell which is more compact than the single conductor one transistor-capacitor memory cell and which has lower gate loading capacitance and less loss of stored charge than the dual conductor one transistor-capacitor memory cell.

SUMMARY OF THE INVENTION

The present invention is directed to a semiconductor memory cell and to arrays of such cells comprising a semiconductor body having a first insulating layer thereon with a first conductor on a portion of the first insulating layer. The semiconductor body-insulating layer-conductor combination forms a charge storage means. A gating means coupled to the charge storage means controls the flow of charge to or from the charge storage means. The gating means has localized first and second input/output semiconductor regions which are separated from one another by portions of the bulk of semiconductor body and has a control second conductor which in response to control signals applied thereto controls the flow of charge through the gating means. The first and second conductors are essentially separated from each other by the second input/output region and are coupled to first and second level conductors, respectively. The first and second level conductors are at different distances from the semiconductor body.

In a preferred embodiment the memory cell uses an epitaxial layer over a semiconductor substrate with the gating means being an n-channel insulated gate field effect transistor having separated drain and source regions. A first level polysilicon conductor is connected to the electrode plate of the capacitor. Separate portions of second level polysilicon conductors are connected to the gate electrode and drain region. The source region can be as small as is possible to reasonably fabricate since the spacing between the first level polysilicon connecting to the gate electrode and the second level polysilicon connecting to capacitor electrode is typically less than a minimum size source region. This reduces the physical size of the memory cell and therefore reduces the size of arrays of the cells and the RAM's in which the arrays are used.

DETAILED DESCRIPTION

Figure 1:
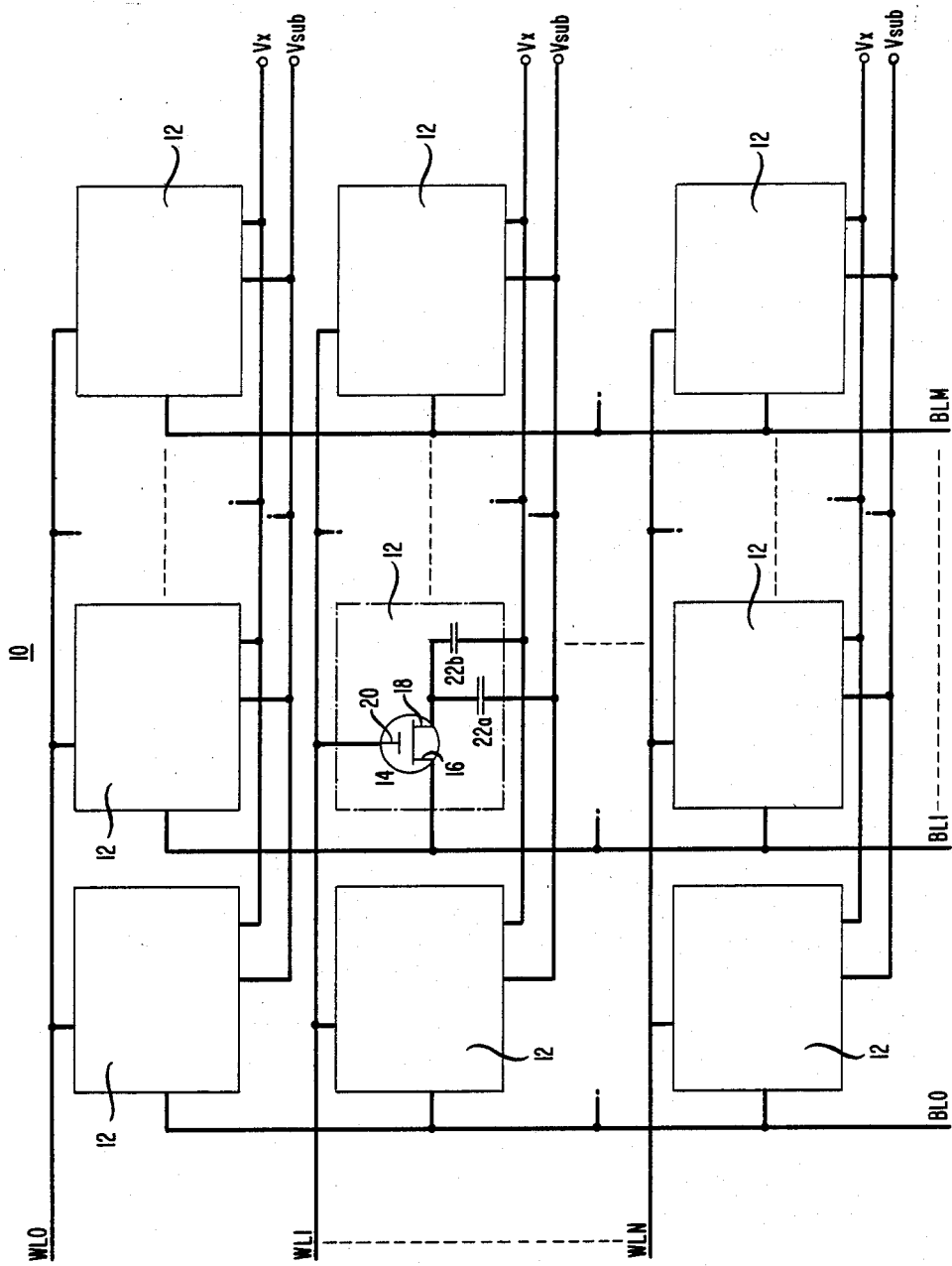
FIG. 1 illustrates in electrical schematic form an array of memory cells.

Referring now to FIG. 1, there is illustrated an NxM array 10 of rows and columns of essentially identical memory cells 12 with each cell comprising an MOS transistor 14 having a drain terminal 16, a source terminal 18, and a gate terminal 20, and an equivalent capacitor coupled to each source terminal 18 which comprises a first capacitor 22a and a second capacitor 22b. In a preferred embodiment array 10 is fabricated on a semiconductor substrate. The first terminals of 22a and 22b are coupled to terminal 18. The second terminal of 22a is coupled to the semiconductor substrate which is typically held at a potential VSub. The second terminal of 22b is coupled to a potential Vx. The gate terminals 20 of the transistors 14 of a given row of transistors 14 are coupled to a common one of the N Word Lines WL0, WL1 ... WLN. The drain terminals 16 of the transistors 14 of a given column of transistors 14 are coupled to a common one of the M Bit Lines BL0, BL1 ... BLM. Access, refresh, and detection circuits well known in the art, but not illustrated herein, are coupled to the word and/or bit lines to provide access to the memory cells 12 and to detect information stored therein. The operation of memory cell 12 is also well known in the art and the reader will be assumed to be familiar with this type of array.

The denotation of terminal 16 as a drain and terminal 18 as a source is appropriate if positive current flows from terminal 16 through transistor 14 and out of terminal 18. If this current reverses then terminal 18 is the drain and terminal 16 is the source.

Figure 2:
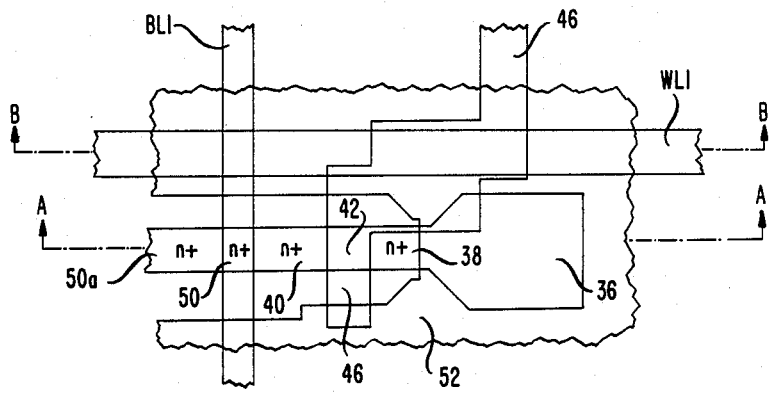
FIG. 2 illustrates a top view of a physical embodiment of memory cells in accordance with the present invention which has the electrical schematic form of the memory cells of FIG. 1.
Figure 3:
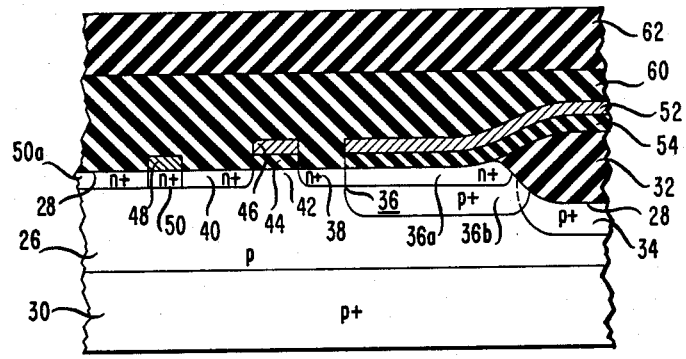
FIG. 3 illustrates a first cross-sectional view of the memory cells of FIG. 2.
Figure 4:
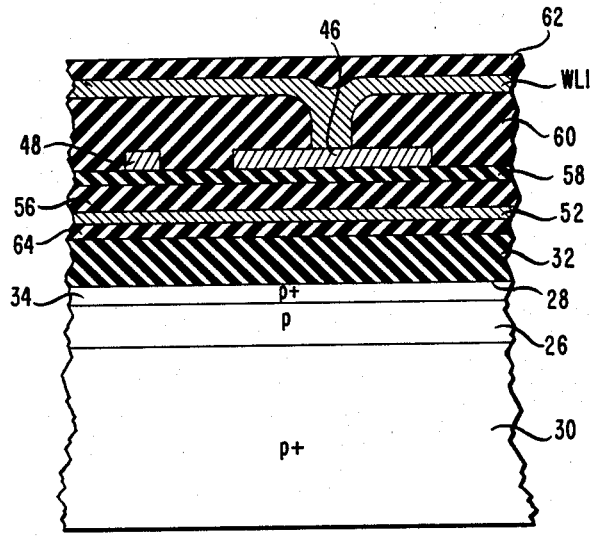
FIG. 4 illustrates a second cross-sectional view of the memory cells of FIG. 2.

Referring now to FIGS. 2, 3 and 4, there is illustrated a physical embodiment of a portion of the memory array 10 of FIG. 1 which includes a memory cell 12 illustrated as being coupled to word line WL1 and to bit line BL1. FIG. 2 illustrates a transparent top view; FIG. 3 illustrates a first cross-sectional view taken along dash line A—A of FIG. 2; and FIG. 4 illustrates a second cross-sectional view taken along dash line B—B of FIG. 2. For illustrative purposes, the various doped regions of FIGS. 2, 3 and 4 are consistent with n-channel type memory cells 12. The impurity type could be easily modified to provide a p-channel type memory cell. Variations of these regions can be formed by ion implantation and/or diffusion, and/or a combination of both.

In one preferred embodiment the memory cell array 10 is formed by utilizing a p type epitaxial layer 26 having a major surface 28 on top of a p+ type substrate 30. The memory array 10 is basically formed in the epitaxial layer 26. Epitaxial layer 26 can be eliminated and the memory array 10 could be formed directly in substrate 30. In such case substrate 30 would be less heavily doped than if an epitaxial layer is used. Field oxide 32 and channel stop region 34 acts as the right a boundary of each memory cell 12. As is discussed below, another essentially identical memory cell extends to the right, symmetrical with respect to a common drain electrode 48. One portion of a storage region 36 contacts part of field oxide 32 and channel stop region 34. Region 36 has a top portion 36a and a bottom portion 36b. Portion 36a of region 36 is typically ion implanted with n type impurities and is relatively close to surface 28. Portion 36b of region 36 is typically implanted with p type impurities and lies substantially below portion 36a. Each region 36b of a particular memory cell 12 is in relatively low resistive connection with all other regions 36b of all memory cells 12 of memory array 10. Regions 36b of all of the memory cells 12 of memory array 10 are also electrically connected together through p type epitaxial layer 26 and through p+ type substrate 30. Region 36a forms part of capacitor 22a and acts as one plate of the capacitor with region 36b in electrical contact with substrate 30 acting as the other plate. A portion of a first level conductor (Poly I) contacts electrode (conductor) 52, which is separated from storage region 36 by a dielectric layer 54 (typically silicon dioxide). Electrode 52 acts as one plate of capacitor 22b with region 36a acting as the other plate. Region 36a contacts an n+ type source region 38.

The transistor 14 of FIG. 1 is formed with an n+ type drain region 40, an n+ type source region 38, and a gate electrode 46. As previously discussed, the roles of regions 38 and 40 reverse during operations. N+ type drain region 40 is separated from source region 38 by p-type portions 42 epitaxial layer 26. In operation, these portions 42 of layer 26 are selectively inverted to form a channel which electrically connects drain region 40 with source region 38. In a preferred embodiment, portions 42 of epitaxial layer 26 are ion implanted to control the threshold voltage of the MOS transistor. Gate insulator layer 44 overlies portions of surface 28. A gate electrode (conductor) 46 overlies the portion of gate oxide region 44 which overlies portions 42 of epitaxial layer 26 and is connected to a portion of a second level conductor (Poly II). A drain electrode (conductor) 48 contacts surface 28 and contacts an n+ type region 50 which is in physical and electrical contact with drain region 40. Drain electrode 48 is connected to a portion of the second level conductor (Poly II). An n+ type drain region 50a is next to region 50 and makes electrical contact to region 50. Region 50a is the drain of an adjacent transistor and another memory cell which is also coupled to bit line BL1.

Typically, electrodes 46 and 48 are formed by ion implantation and subsequent thermal treatment of separated portions of an undoped polysilicon layer to make some portions conductors. Oxide layer 44 prevents portions 42 of epitaxial layer 26 from receiving dopants when the implanted polysilicon of region 46 is thermally treated. Since no such oxide layer exists under electrode 48, some of the ions implanted into electrode 48 pass into epitaxial layer 26 during thermal treatment and form n+ type region 50.

A dielectric layer 60, typically of phosphorus glass, (p-glass) covers exposed portions of surface 28 and over dielectric layers, electrical conductors and/or electrodes. A passivation layer 62, typically of silicon nitride, covers layer 60.

The cross-sectional view of FIG. 4 illustrates the semiconductor body and all semiconductor layers, dielectric layers, polysilicon conductor layers, metallic layers, and passivation layers of memory array 10. Starting from the top of the structure, passivation layer 62 (typically, silicon nitride) is over a metallic level WL1, which is typically aluminum, which is over a dielectric (p-glass) layer 60 which is over a second level polysilicon conductor layer (Poly II—used to form conductors (electrodes) 46 and 48 of FIG. 3), which is over a dielectric (second gate oxide) layer 58 (part of which forms layer 44 of FIG. 3), which lies over a second interlevel dielectric layer 56, which lies over a first level polysilicon conductor layer (Poly I—used to form conductor (electrode) 52 of FIG. 3), which is over a dielectric (first gate oxide) layer 64 (part of which forms layer 54 of FIG. 3), which lies over dielectric field oxide) layer 32, which lies over p+ type channel stop region 34, which is formed in a top portion of epitaxial layer 26 which lies over p+ type semiconductor substrate 30.

FIG. 2 illustrates a transparent-type top view of a portion of the array 10. Regions 50, 50a, 40, 42, 38 and 36 all form a portion of surface 28 (illustrated in FIG. 3). WL1 extends downward and contacts a portion of conductor (electrode) 46. Electrode 52 of FIG. 3 is connected to the first level conductor (Poly I) which is separated from surface 28 by portions of dielectric layers 54 and 32.

As has been pointed out previously, electrode 46 is connected to the second level conductor (Poly II) and electrode 52 is connected to the first level conductor (Poly I). This permits source region 38 to be substantially smaller than is the case if the adjacent gate and capacitor electrodes are both first level conductors since most semiconductor design rules set minimum spacing between adjacent same level conductors at a greater value than that needed for a minimum size source region 38. Accordingly, memory cell 12 is reduced in size and thus the entire memory array 10 is also reduced in size.

In some memory arrays that use dual level conductors, such as is disclosed in U.S. Pat. No. 4,112,575, the p+ type channel stop region is separated from the two implanted regions in the substrate which are under the capacitor field plate. One problem with this configuration is that alpha particles (radiation) hitting the memory cell result in a build up of positive charge in the p+ type regions (like region 36b) due to hole collection which results in a reduction in the p+(region 36b)/p(epitaxial layer 26) barrier height that allows net positive charge stored with the memory cell to be reduced. This causes a loss of stored logic information and reduces operating margins. The connecting together of all regions 36b through heavily doped (relatively low resistance) channel stop regions 34 lowers the average positive charge build up within region 36b of any memory cell 12 and thus reduces the loss of stored information. Thus memory arrays 10 having less sensitivity to the alpha particles are achieved. This improves overall operating noise margins and contributes to smaller arrays since the storage capacitors can be smaller than is the case if regions 36b are not interconnected via low resistance paths.

A 64K n-channel RAM using the memory array of FIG. 1 with memory cells having the basic structure of FIGS. 2, 3 and 4 has been built and found functional. The size of a memory cell is 25×9.5 square microns. The use of only one level of conductors would have increased the size of the memory cell to 27×9.5 square microns. Thus there is an 8 percent savings in memory cell area with no essential loss in performance or noise margins. The memory cells occupy approximately 60 percent of the area of the entire RAM. Accordingly, there is a reduction in the total chip size of the RAM of approximately 4.8 percent. In the embodiment of the 64K RAM which was fabricated the transistors are formed using a self-aligned process and the p+ type substrate was 250 microns thick and had an impurity concentration of 1019 impurities/cm$^3$. The self-aligned process results in essentially fixed channel lengths for the transistors and thereby helps reduce variations in response time. The p type epitaxial layer is 10 microns thick and has an impurity concentration of $2 \times 10^{15}$ impurities/cm$^3$. The n+ type source region is 3 microns wide, 2 microns long, and 0.5 microns thick and has an impurity concentration of $2 \times 10^{20}$ impurities/cm$^3$. The n+ type drain region is 3 microns wide, 4 microns long, and 0.5 microns thick and has an impurity concentration of $2 \times 10^{20}$ impurities/cm$^3$. The epitaxial layer top portion (36a) of the capacitor has a thickness of 0.5 microns and the bottom portion (36b) had a thickness of 1.0 microns. The surface area of the epitaxial portion of region 36 is 151.5 square microns and the impurity concentration of n+ type region 36a is $2 \times 10^{18}$ impurities/cm$^3$, and the impurity concentration of p+ type region 36b is $3 \times 10^{16}$ impurities/cm$^3$. Channel region 42 is 3 microns wide. The gate dielectric 44 is silicon dioxide having a thickness of 0.05 microns and a width of 2 microns. The dielectric layer 54 is silicon dioxide having a thickness of 0.04 microns. Electrode conductors 46, 48, and 52 are all polysilicon. Dielectric layer 32 is silicon dioxide having a thickness of 1.0 microns. The interlevel dielectric layer 56 is silicon dioxide and is 0.30 microns thick. The dielectric layer 60 is p-glass and is 1.0 microns thick. The word lines are aluminum which are 1.0 microns thick. The passivation layer 62 is silicon nitride and is 1.0 microns thick.

The embodiments described herein are intended to be illustrative of the general principles of the present invention. Various modifications are possible consistent with the spirit of the invention. For example, the n-channel insulated gate MOS transistor could be replaced by a p-channel insulated gate MOS transistor, an n or p-channel MOS junction transistor, an n-p-n or p-n-p junction bipolar transistor, a gated diode switch, or a variety of other devices. Still further, with some layout modification, the polysilicon conductors could be replaced with metallic conductors or a variety of other possible conductors. Still further, the gate electrode could be connected to a first level conductor and the top capacitor electrode could be connected to a second level conductor. Still further, the source, gate and top capacitor electrodes could alternately be coupled to first, second, and first level conductors, respectively, or to second, first, and second level conductors, respectively.

What is claimed is:

1. A semiconductor memory cell comprising:
   a charge storage means having an insulating layer overlying a storage region of a semiconductor body and a first conductor overlying the insulating layer;
   an insulated gate field effect transistor coupled to the charge storage means for controlling the flow of charge to or from the charge storage means, with said transistor having localized first and second input/output semiconductor regions of a first conductivity type and separated from one another by a channel of a second conductivity type opposite to said first type, and having a second conductor which is adapted to control the flow of charge through said channel in response to a control signal;
   characterized in that
   said first and second conductors are essentially separated from one another by the second input/output region, with the first conductor forming a first capacitor plate that is coupled to a portion of a first level conductor, and the second conductor forming a gate electrode that is coupled to a portion of a second level conductor, wherein the second level conductor overlies the first level conductor and is dielectrically spaced therefrom over a portion of said body;
   and wherein a surface portion of said storage region is doped with an impurity of said first conductivity type to form a second capacitor plate that contacts said second input/output region.

2. The cell of claim 1 wherein an underlying portion of said storage region is doped with an impurity of said second conductivity type so as to increase the capacity of said charge storage means.

3. The cell of claim 1 wherein said first and second conductors comprise polysilicon.

4. The cell of claim 1 wherein said first conductivity type is n-type, and said second conductivity type is p-type, wherein said transistor is an n-channel field effect transistor.

5. The cell of claim 1 wherein the concentration of the impurity of said first conductivity type in said second input/output region is greater than the concentration of the impurity of said first conductivity type in said surface portion of said storage region.

6. A multiplicity of memory cells of claim 1 arranged in an array of rows and columns, with said cells further comprising a localized channel stop region of relatively low resistivity and of said second conductivity type, and wherein said channel stop region contacts said underlying portion of said storage region.

* * * * *

UNITED STATES PATENT AND TRADEMARK OFFICE
CERTIFICATE OF CORRECTION

PATENT NO. : 4,887,135

DATED : December 12, 1989

INVENTOR(S) : Glen T. Cheney, Howard C. Kirsch, James T. Nelson, and James H. Stefany It is certified that error appears in the above-identified patent and that said Letters Patent is hereby corrected as shown below:

Col. 5, line 20, delete 1019 and insert therefore --$10^{19}$--.

Signed and Sealed this

Twelfth Day of March, 1991

Attest:

HARRY F. MANBECK, JR.

Attesting Officer

Commissioner of Patents and Trademarks